(12) United States Patent
Ivanov et al.

(10) Patent No.: US 9,973,161 B2
(45) Date of Patent: *May 15, 2018

(54) MULTISTAGE AMPLIFIER CIRCUIT WITH IMPROVED SETTLING TIME

(71) Applicant: Texas Instruments Incorporated, Dallas, TX (US)

(72) Inventors: Vadim V. Ivanov, Tucson, AZ (US); Vaibhav Kumar, Tucson, AZ (US); Munaf H. Shaik, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/489,187

(22) Filed: Apr. 17, 2017

(65) Prior Publication Data

US 2017/0222610 A1 Aug. 3, 2017

Related U.S. Application Data (63) Continuation of application No. 14/790,592, filed on Jul. 2, 2015, now Pat. No. 9,634,617.

(Continued)

(51) Int. Cl.
*H03F 3/68* (2006.01)
*H03F 3/45* (2006.01)
(Continued)

(52) U.S. Cl.
CPC ............ *H03F 3/68* (2013.01); *H03F 1/3223* (2013.01); *H03F 3/211* (2013.01);
(Continued)

(58) Field of Classification Search
USPC ............................... 330/124 R, 295, 84, 286
See application file for complete search history.

(56) References Cited

U.S. PATENT DOCUMENTS 4,750,128 A 6/1988 Honda et al.
4,851,786 A 7/1989 Vinn et al.
(Continued)

OTHER PUBLICATIONS

Fan et al., "A Multi-Path Chopper-Stabilized Capacitively Coupled Operational Amplifier with 20V-Input-Common-Mode Range and 3 µV Offset"; Delft University of Technology, Delft, The Netherlands; 2013 IEEE International Solid-State Circuits Conference. ISSCS 2013/Session 10/ Analog Techniques/10.3 (3 pages).

*Primary Examiner* — Hieu Nguyen
(74) *Attorney, Agent, or Firm* — John R. Pessetto; Charles A. Brill; Frank D. Cimino (57) ABSTRACT

Described examples include multistage amplifier circuits having first and second forward circuits, a comparator or sensor circuit coupled to sense a signal in the second forward circuit to identify nonlinear operation or slewing conditions in the multistage amplifier circuit, and one or more sample hold circuits operative according to a sensor circuit output signal to selectively maintain the amplitude of an amplifier input signal in the second forward circuit and/or in a feedback circuit in response to the sensor circuit output signal indicating nonlinear operation or slewing conditions in the multistage amplifier circuit. Certain examples further include a clamping circuit operative to selectively maintain a voltage at a terminal of a Miller compensation capacitance responsive to the comparator output signal indicating nonlinear operation or slewing conditions.

16 Claims, 4 Drawing Sheets

Related U.S. Application Data (60) Provisional application No. 62/020,070, filed on Jul. 2, 2014.

(51) Int. Cl.
    *H03F 1/32*     (2006.01)
    *H03F 3/21*     (2006.01)

(52) U.S. Cl.
    CPC ..... *H03F 3/45959* (2013.01); *H03F 3/45986* (2013.01); *H03F 2200/78* (2013.01)

(56) References Cited

U.S. PATENT DOCUMENTS

| | | |
|---|---|---|
| 4,931,745 A | 6/1990 | Goff et al. |
| 5,327,100 A | 7/1994 | Stockstad et al. |
| 6,359,512 B1 | 3/2002 | Ivanov et al. |
| 6,437,645 B1 | 8/2002 | Ivanov et al. |
| 6,639,460 B1 | 10/2003 | Botker |
| 7,034,611 B2 | 4/2006 | Oswal et al. |
| 7,132,883 B2 | 11/2006 | Huijsing et al. |
| 7,233,198 B2 | 6/2007 | Niederkorn |
| 7,292,095 B2 | 11/2007 | Burt et al. |
| 7,518,440 B1 | 4/2009 | Trifonov |
| 7,535,295 B1 | 5/2009 | Huijsing et al. |
| 7,586,368 B2 | 9/2009 | Trifonov |
| 7,733,169 B2 | 6/2010 | Zhang et al. |
| 7,764,118 B2 | 7/2010 | Kusuda et al. |
| 7,888,996 B1 | 2/2011 | Barnett |
| 8,072,262 B1 | 12/2011 | Burt et al. |
| 8,217,721 B1 | 7/2012 | Hsieh |
| 8,390,379 B2 | 3/2013 | Snoeij et al. |
| 9,294,049 B2 | 3/2016 | Huijsing et al. |
| 2002/0109547 A1 | 8/2002 | Ivanov et al. |
| 2002/0158691 A1 | 10/2002 | Blankenship et al. |
| 2005/0285676 A1 | 12/2005 | Jones |
| 2009/0102560 A1 | 4/2009 | Harvey |
| 2012/0086509 A1 | 4/2012 | Snoeij et al. |
| 2014/0266435 A1 | 9/2014 | Botker |
| 2015/0091647 A1 | 4/2015 | Kumar et al. |

MULTISTAGE AMPLIFIER CIRCUIT WITH IMPROVED SETTLING TIME

The present application is a continuation of U.S. Nonprovisional patent application Ser. No. 14/790,592, filed Jul. 2, 2015, which claims priority to and the benefit of U.S. Provisional Patent Application Ser. No. 62/020,070, filed Jul. 2, 2014 and entitled MULTISTAGE AMPLIFIER SETTLING TIME ENHANCEMENT METHOD, the entirety of which is hereby incorporated by reference.

TECHNICAL FIELD

The present disclosure relates generally to amplifiers, and more particularly to multistage amplifier circuits with circuitry for improved settling time.

BACKGROUND

Multistage amplifier circuits are used to amplify a received input signal, and often include multiple stages with an output op amp and transconductance amplifiers, with a chopped high gain low frequency forward loop to remove offsets and filter low frequency noise to achieve high DC accuracy. However, during slewing to track transitions in the input signal or during overload conditions or other nonlinear operation, capacitors within the multistage amplifier circuitry can be charged to voltage values having no correlation to values during steady state linear operation. Once normal operation is resumed following this unpredictable circuit capacitor charging or discharging, the settling time of the multistage system is determined by op amp linear settling time as well as time necessary to recharge all other capacitors to voltages required for operation in linear region. As a result, output settling after non-linear operation can be much longer than the linear settling time. Various techniques have been proposed for improving settling time for three stage amplifier circuits using a feedforward link, but these approaches are generally unsuitable for more complicated multistage amplifier architectures.

SUMMARY

Described examples include multistage amplifier circuits with first and second forward circuits, and a comparator or sensor circuit coupled to sense a signal in the second forward circuit to identify nonlinear operation or slewing conditions. One or more sample hold circuits selectively maintain the amplitude of an amplifier input signal in the second forward circuit and/or in a feedback circuit in response to the sensor circuit output signal indicating nonlinear operation or slewing conditions in the multistage amplifier circuit. In some examples a clamping circuit selectively maintains a voltage at a terminal of an output compensation capacitance when the comparator output signal indicates sensed nonlinear operation or slewing conditions. Methods are also described for reducing settling time in multistage amplifiers having a high frequency forward circuit and a low frequency forward circuit, including sensing a signal in the low frequency forward circuit to detect nonlinear operation or slewing conditions in the multistage amplifier circuit, generating a sensor circuit output signal in a first state when nonlinear operation or slewing conditions are detected, and a second state when no nonlinear operation or slewing conditions are detected, and maintaining an amplitude of a signal in the low frequency forward circuit when the sensor circuit output signal is in the first state.

DETAILED DESCRIPTION

In the drawings, like reference numerals refer to like elements throughout, and the various features are not necessarily drawn to scale. As used herein, the term "coupled" includes circuits or components electrically connected to one another directly or with one or more intervening circuits or components.

Figure 1:
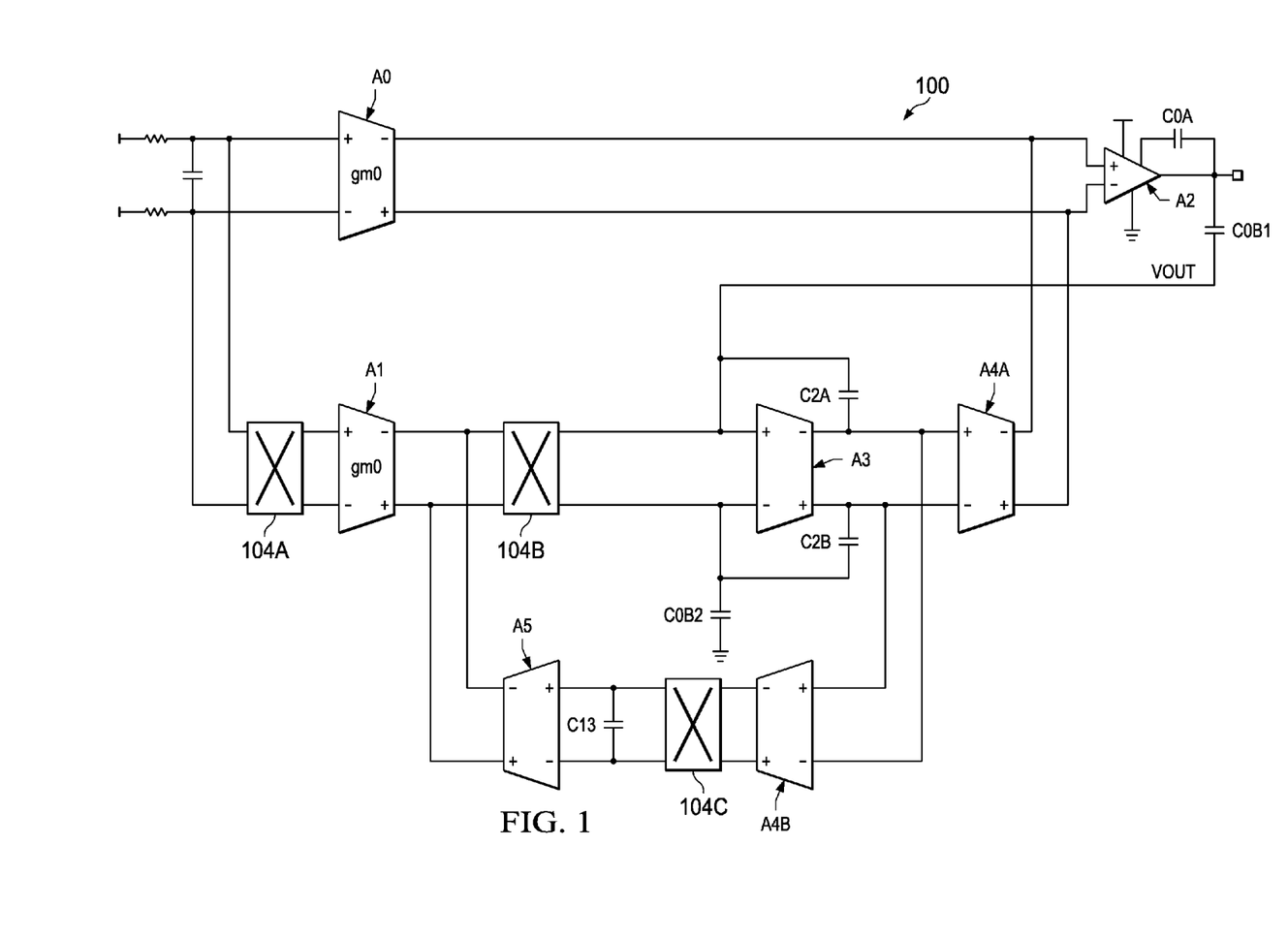
FIG. 1 is a schematic diagram of a multistage amplifier circuit with poor settling time performance.

FIG. 1 shows a multistage amplifier circuit 100 with a low gain transconductance amplifier A0 (e.g., unity gain gm0=1) amplifying a differential input and providing a differential signal to an output op amp A2 which provides a system output signal VOUT. A second forward circuit including chopper circuits 104A and 104B and transconductance amplifiers A1, A3 and A4A removes low frequency or DC offsets. The second path provides high gain and low frequency performance via bandwidth-limiting capacitors C2A and C2B in feedback paths around A3, with a further capacitor COB2 connected from the negative input of A3 to ground. A feedback filter circuit includes amplifiers A4B and A5 and an intervening chopper circuit 104C is provided around the second chopper circuit 104B and amplifier A3. Miller compensation feedback capacitors COA and COB1 are connected to the output of the op amp A2 to close inner and outer feedback loops for Miller compensation of the chopped low-frequency (chopped) path.

In the circuit 100, the op amp settling time in the linear region is controlled by the circuit bandwidth (gm0/COA with unity feedback) provided that other circuit capacitances and gains are designed such that there are no pole/zero doublets. However, during slewing, overload or non-linear operation of the multistage system 100, the voltage at the lower terminal of the Miller capacitor COB1 may drift or change to a voltage amplitude that exacerbates recovery to steady state operation, thereby lengthening system settling time. Also, other circuit capacitors in the circuit 100 can be charged to unpredictable values potentially far from normal values during linear operation. This circuit 100 therefore suffers from system settling times potentially 10-100× longer than the linear settling time of the component amplifiers themselves due to variations in capacitor charging voltages during slewing.

Figure 2:
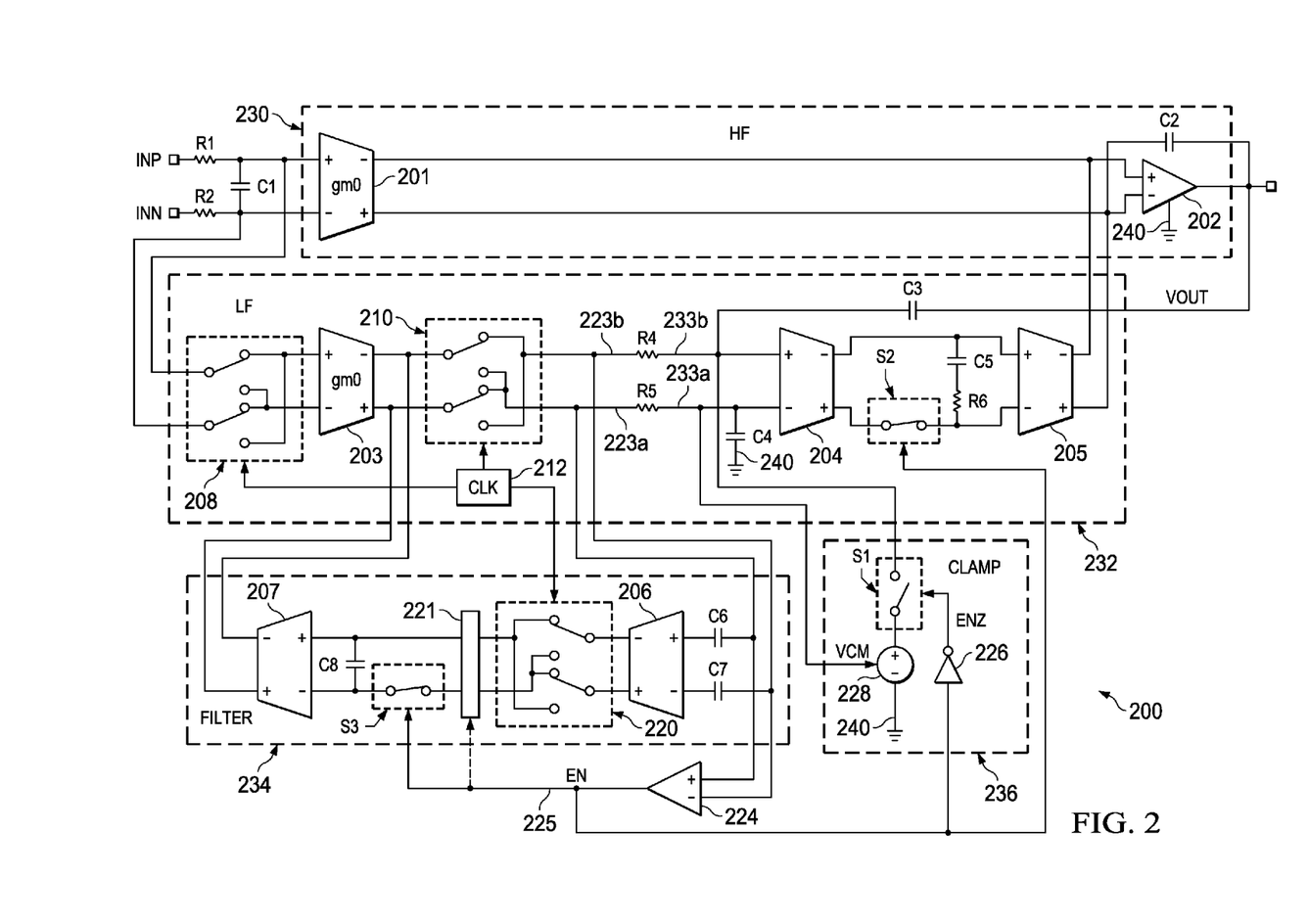
FIGS. 2 and 3 are schematic diagrams of a multistage amplifier circuit including a high-frequency forward circuit path, a low frequency chopped forward circuit path, and a feedback ripple reduction filter circuit path, as well as circuitry for enhancing settling time performance.
Figure 3:
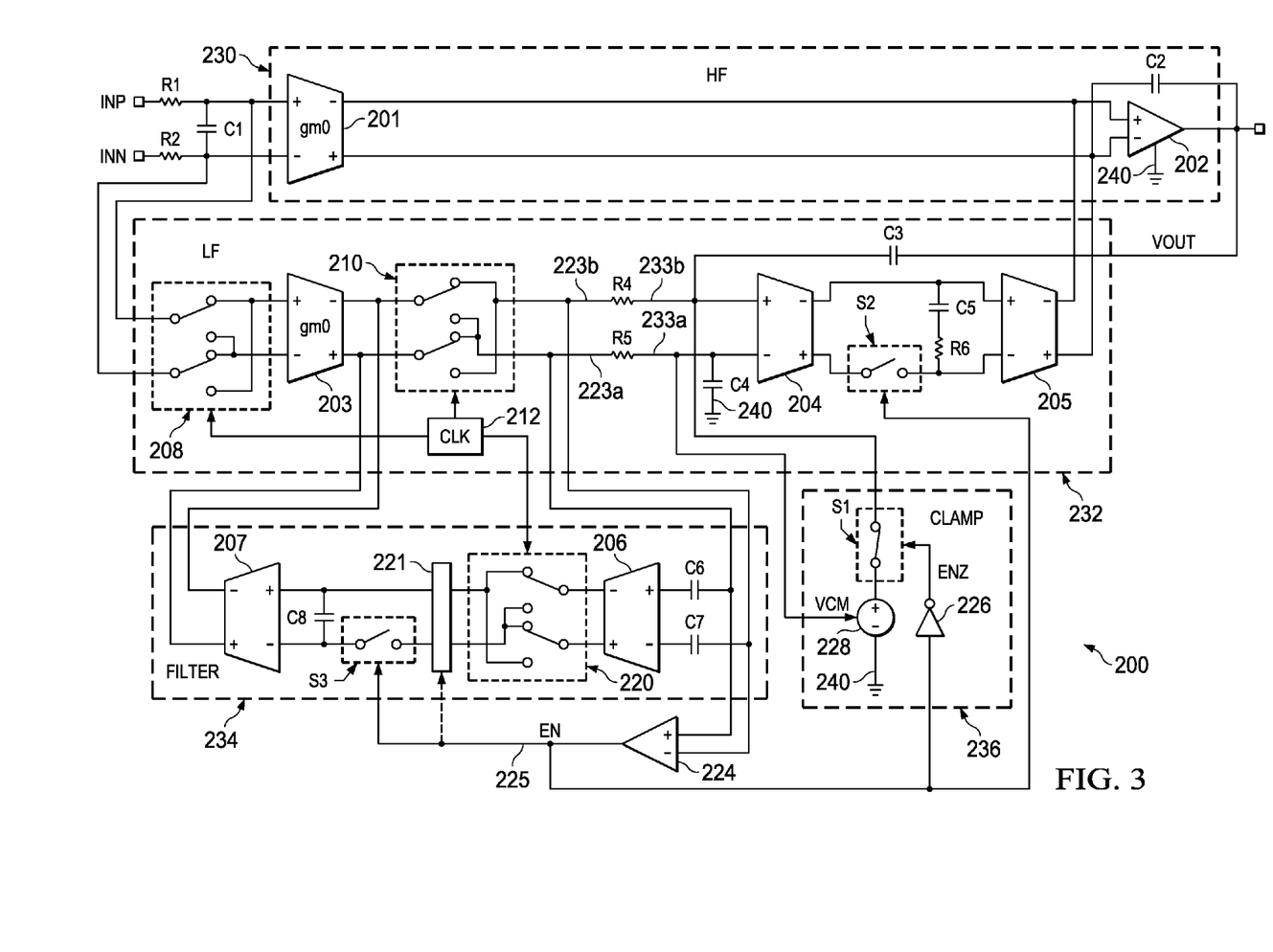

FIGS. 2 and 3 show a multistage amplifier circuit 200 including a high-frequency first forward circuit path 230 (labeled HF) with amplifiers 201 and 202. The system 200 further includes a higher gain low frequency second forward circuit 232 (labeled LF) with amplifiers 203, 204 and 205 as well as chopper circuits 208 and 210 operated according to a clock signal from a clock circuit 212. A third circuit 234 provides feedback ripple reduction filtering via a sixth amplifier 206, a third chopper circuit 220, a notch filter circuit 221 and a seventh amplifier 207. In one example 200, the amplifiers 201 and 203-207 are differential transconductance amplifiers with differential inputs and outputs as shown in FIGS. 2 and 3. The first amplifier 201 has a first amplifier input that receives a differential input signal labeled INP and INN, with the illustrated example including input RC filtering via resistors R1 and R2 and an input capacitor C1, although these components can be omitted in other examples. The second amplifier 202 has a second amplifier input coupled with the output of amplifier 201, as well as a second amplifier output providing the system output signal VOUT. An upper compensation capacitor C2 is coupled between the negative input and the output of the amplifier 202 and a lower Miller compensation capacitor C3 has a first terminal coupled to the output of amplifier 202 to receive the output signal VOUT, and a second terminal coupled with the input 233b of the fourth amplifier 204.

The low-frequency second circuit 232 operates to remove offsets (e.g., DC errors and any low-frequency errors) associated with the high frequency path. The third amplifier 203 of the second forward circuit 232 includes a third amplifier input coupled to receive the input signal INP, INN, and the fourth amplifier 204 includes a fourth amplifier input labeled 233a and 233b that is coupled with the output of the third amplifier 203. A capacitor C4 is coupled in the example between the input 233a and a circuit ground 240. The fifth amplifier 205 has a fifth amplifier input coupled with an output of the fourth amplifier 204 with a series combination of a resistor R6 and a capacitor C5 connected across the input of the fifth amplifier 205. C5 and R6 perform filtering on the output of transconductance amplifier 204 to provide the input to transconductance amplifier 205 and provide output load compensation for the transconductance amplifier 204. The fifth amplifier output of amplifier 205 is coupled to adjust the second amplifier input of amplifier 202 as shown. The first chopper circuit 208 is coupled between the first amplifier input and the third amplifier 203 and includes a first switching circuit that alternately inverts the input signal INP, INN according to the signal from clock circuit 212 to provide a first chopped differential input signal to the third amplifier input. The second chopper circuit 210 includes a second switching circuit to alternately invert the differential output signal from the amplifier 203 according to the clock signal to provide a second chopped differential input signal on lines 223a and 223b and is coupled to the fourth amplifier inputs 233a and 233b through resistors R4 and R5.

The multistage circuit 200 in FIGS. 2 and 3 also includes a third circuit 234 providing a feedback loop to the second forward circuit 232. The lower feedback path 234 operates as a ripple reduction loop to reduce the ripple caused by chopping in the low-frequency path 232. The third circuit 234 includes the sixth amplifier 206 having a sixth amplifier input coupled with the input of the fourth amplifier 204, and the seventh amplifier 207 has a differential seventh amplifier input coupled with an output of the sixth amplifier 206 through the third chopper circuit 220 and a notch filter 221. The notch filter 221 in one example includes an output integrating capacitor C8 providing an input voltage signal across the seventh amplifier input. The transconductance amplifier 206 provides a gain stage which adds or subtracts offset current from the output of transconductance amplifier 203 to implement noise compensation filtering for combating chopper ripple. The notch filter 221 in one example also operates according to a phase-shifted clock signal from the circuit 212 to provide a voltage input to the amplifier 207 across C8. The third chopper circuit 220 has a third switching circuit operated according to a clock signal from the circuit 212 to alternately invert the differential output signal of the sixth amplifier 206 to provide a third chopped differential input signal to the notch filter 221.

As further shown in FIGS. 2 and 3, the multistage circuit 200 includes circuitry 224, 236, and S1-S3 for enhancing settling time performance. FIG. 2 shows the circuit 200 in normal operating mode and FIG. 3 shows the circuit 200 in a first state during sensed slewing or non-linear circuit operation. To accelerate return to normal operation following slewing, overloads or other non-linear operation, the circuit 200 includes a sensor circuit 224 coupled with the second forward circuit 232 to sense nonlinear operation or slewing conditions of the multistage amplifier circuit 200, as well as one or more sample hold circuits S2, S3 and a clamp circuit 236 operated according to a sensor circuit output signal EN on sensor output line 225. In one example, the sensor circuit 224 is a comparator including a first comparator input (+) coupled with the first differential input 233a of the fourth amplifier 204, and a second comparator input (−) coupled with a second differential input 233b of the fourth amplifier 204. In one example, the comparator circuit 224 provides hysteresis to detect deviations in the signal input through resistors R4 and R5 to the amplifier 204 above a threshold amount. In one example, the comparator circuit output provides the signal EN in a first state (e.g., HI) when the difference between voltages at the first and second comparator inputs exceeds a non-zero threshold indicating slewing conditions in the multistage amplifier circuit 200. Otherwise, the signal EN is provided in a second state (e.g., LO).

A first sample hold circuit S2 is coupled with the fifth amplifier input, and operates according to the comparator circuit output signal EN to maintain the amplitude of a signal at the fifth amplifier input when the sensor circuit output signal EN is in the first state. In this example, moreover, a second sample hold circuit S2 is coupled with the seventh amplifier input to maintain the amplitude of a signal at the seventh amplifier input when the sensor circuit output signal EN is in the first state. In this manner, the capacitor voltages of C5 and C8 are held while the multistage circuit undergoes non-linear operation or slewing. Upon return to normal operation, the entire circuit 200 can more quickly settle to steady state operation, with the resulting settling time being primarily driven only by the slew rates of the various amplifiers themselves. When the switch S2 is opened during slewing operation of the system 200, the voltage across C5 and thus across the input of the transconductance amplifier 205 is frozen or maintained, and similarly the voltage across C8 is maintained in the third circuit 234 via switch S3. The notch filter 221 in one example operates according to a phase-shifted clock, and the filter circuit 221 is also controlled from the feedback signal 225 by the opening of the switch S3. The capacitance C8 in one embodiment is an integrating capacitor for the output of the notch filter 221. When the switch S3 is open, the voltage across C8 is frozen or maintained during slewing according to the control signal 225. In this way, any effects of slewing in the system 200 are not seen by the inputs of amplifiers 205 and 207, and the system 200 can return quickly to normal operation.

In addition, the clamping circuit 236 clamps the left side of the Miller compensation capacitance C3 during slewing. The clamp circuit 236 is coupled with the fourth amplifier inputs 233a and 233b in one example and selectively maintains the voltage at the second terminal of the compensation capacitance C3 when the sensor circuit output signal EN is in the first state. This is schematically shown in FIGS. 2 and 3 with a common mode voltage source 228 providing a voltage VCM to drive the line 233b in a manner controlled according to the voltage at line 233a. The EN signal on line 225 closes the switch S1 during slewing, and provides a common mode voltage 228 to the left side terminal of C3 to stabilize this Miller capacitor voltage during slewing. Other implementations are possible for a clamping circuit that selectively provides currents to R4 and R5 to keep the voltages at the two inputs of the transconductance amplifier 204 close to one another using any suitable circuitry.

Figure 4:
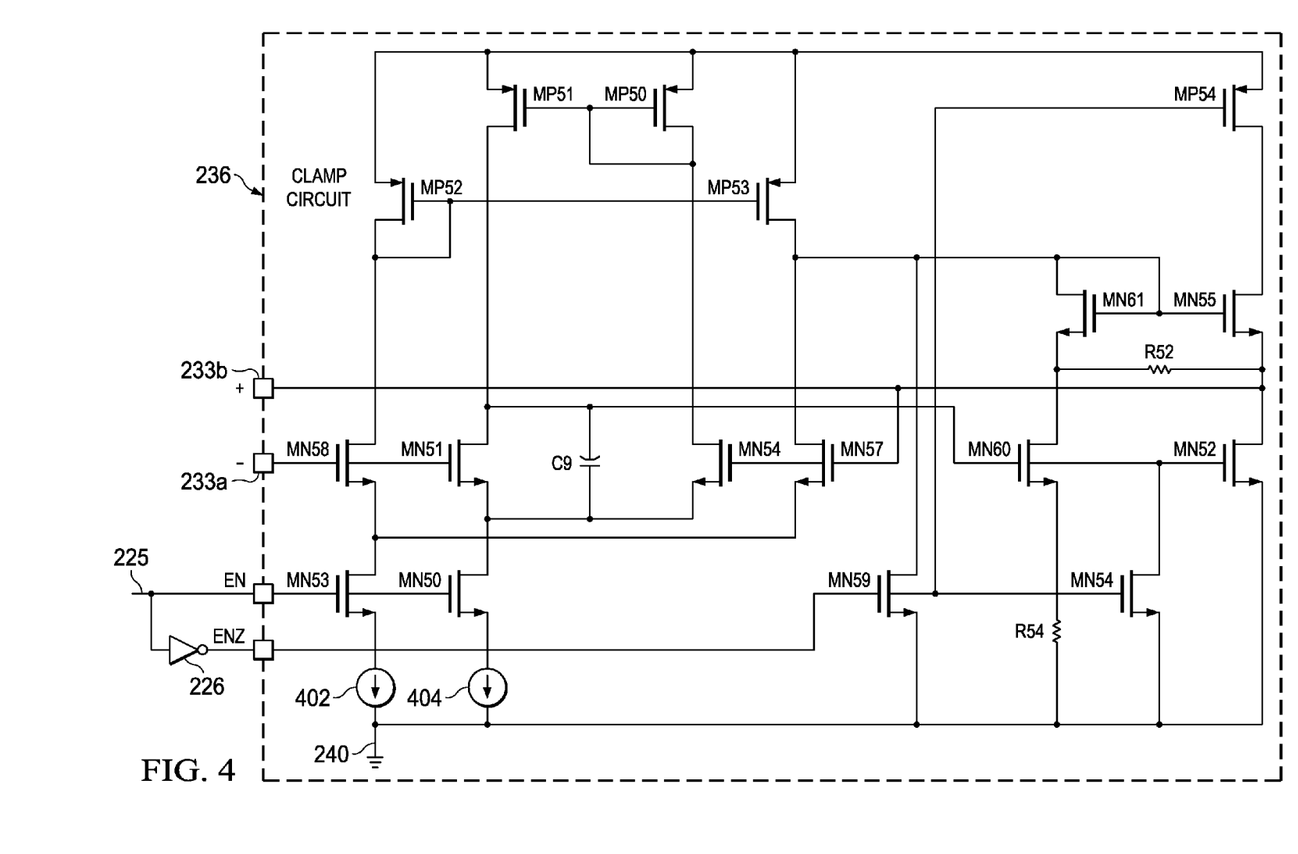
FIG. 4 is a schematic diagram of a clamping circuit in the settling time enhancement circuitry of FIGS. 2 and 3.

FIG. 4 shows an example clamping circuit 236 that can be used in the settling time enhancement circuitry of FIGS. 2 and 3. In this example, the circuit 236 drives the voltage at the first differential input 233a of the fourth amplifier 204 to the voltage at the second differential input 233b of the fourth amplifier 204 when the sensor circuit output signal EN is in the first state (HI). The circuit 236 includes two operational transconductance amplifiers (OTAs). MN57 and MN58 are input transistors for a first OTA, with the gate terminals of MN57 and MN58 respectively receiving the non-inverting and inverting inputs from lines 233a and 233b. The first OTA also includes upper current mirror transistors MP52 and MP53, and a lower transistor MN53 connected through a current source 402 to ground 240. The first OTA is enabled during slewing operation by a high EN signal at the comparator output line 225, which is connected to the gate of MN53. The drain of MP53 provides an output from the first OTA to the gates of transistors MN55 and MN61 whose source terminals are connected to opposite ends of a first resistor R52. A transistor MN59 operates according to a gate signal ENZ to selectively pull the first OTA output line low when the ENC signal is high to disable the clamp circuit 236 during normal operation. During slewing operation, ENZ is low, allowing the first OTA to control the first amplifier output provided to the gates of MN55 and MN61.

The second OTA in FIG. 4 includes input transistors MN51 and MN54 with gate terminals connected to the lines 233a and 233b, respectively. The second OTA also includes upper current mirror transistors MP50 and MP51, and a control transistor MN50 connected between the input transistors MN51 and MN54 and a current source 404, with the EN signal line 225 connected to the gate control terminal of MN50. The clamp circuit 236 also includes a feedback system in which the inputs from lines 233a and 233b are in a closed loop configuration with the input line 233b connected to the source of MN55.

If the voltage on line 233b increases, the first OTA transistors MN57 and MN58 provide a negative feedback action which changes the voltage online 233b very close to that of 233a. The drain terminal of MN51 provides a second OTA output signal connected to the gates of transistors MN52 and MN60 with a source terminal of MN60 connected through a second resistor R54 to the circuit ground 240. The drain terminals of MN52 and MN60 are connected to the source terminals of MN55 and MN61, respectively, at opposite ends of the resistor R52. Resistor R52 improves the matching of the current mirror formed by MN55 and MN61. A transistor MN54 operates according to the ENZ signal to selectively pull the second OTA output line to ground 240 during normal operation (ENZ high) disable the clamp circuit 236, while allowing the second OTA to control the gates of MN52 and MN60 during slewing operation. MN52 provides the current according to the output of the first OTA amplifier at the drain of MP53, and MN52 conducts current according to the output of the second OTA amplifier at the drain of MP51, and this current is provided at the line 233b to clamp or stabilize the voltage at the left hand terminal of the Miller capacitor C3 in FIGS. 2 and 3 and to bring the voltages at lines 233a and 233b close to one another during slewing operation of the multistage amplifier system 200. In one example, the clamping circuit 236 brings the inputs of the transconductance amplifier 204 to within a few millivolts of one another during slewing operation, and also maintains the left side terminal of C3 at a relatively constant clamped voltage schematically illustrated as a voltage source VCM 228 in FIGS. 2 and 3.

The operation of the described and equivalent circuitry provide methods for reducing settling time in a multistage amplifier circuit 200. The methods include sensing a signal in a low frequency forward circuit 232 to detect nonlinear operation or slewing conditions in the multistage amplifier circuit 200, and generating a sensor circuit output signal EN in a first state (e.g., HI) when nonlinear operation or slewing conditions are detected, and otherwise providing the sensor signal EN in a second state (e.g., LO) when no nonlinear operation or slewing conditions are detected. The methods further include maintaining or controlling the amplitude of a signal in the low frequency forward circuit 232 when the sensor circuit output signal EN is in the first state. In some examples, this is done via sample hold circuits (e.g., S2 and/or S3 above) and/or through clamping circuitry 236 or other suitable means.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims. In addition, although a particular feature of the disclosure may have been disclosed with respect to only one of multiple implementations, such feature may be combined with one or more other features of other embodiments as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

The following is claimed:
1. A multistage amplifier circuit, comprising:
a first forward circuit, including a first amplifier having a first amplifier input to receive an input signal, and a second amplifier having a second amplifier input coupled with an output of the first amplifier, the second amplifier including a second amplifier output providing an output signal;
a second forward circuit, including a third amplifier having a third amplifier input coupled to receive the input signal, the third amplifier having a third amplifier output coupled with the second amplifier input; and
a sensor circuit coupled with the second forward circuit to sense nonlinear operation or slewing conditions of the multistage amplifier circuit, the sensor circuit having a sensor circuit output providing a sensor circuit output signal in a first state when nonlinear operation or slewing conditions are sensed in the multistage amplifier circuit, and in a second state when nonlinear operation or slewing conditions are not sensed in the multistage amplifier circuit;
wherein the second forward circuit further includes a fourth amplifier having a fourth amplifier input coupled with an output of the third amplifier, and a fifth amplifier having a fifth amplifier input coupled with an output of the fourth amplifier, the fifth amplifier having a fifth amplifier output coupled with the second amplifier input, and wherein the third amplifier output is coupled to the second amplifier input via the fourth and fifth amplifiers, the multistage amplifier circuit further comprising:
a first sample hold circuit coupled with the fifth amplifier input to maintain the amplitude of the signal at the fifth amplifier input when the sensor circuit output signal is in the first state.

2. The multistage amplifier circuit of claim 1, wherein the fourth amplifier input includes first and second differential inputs, and wherein the sensor circuit is a comparator circuit including a first comparator input coupled with the first differential input of the fourth amplifier, a second comparator input coupled with the second differential input of the fourth amplifier, and a comparator output providing the sensor circuit output signal.

3. The multistage amplifier circuit of claim 2, wherein the input signal is a differential signal, and wherein the second forward circuit comprises:
a first chopper circuit positioned between the first amplifier input and the third amplifier input, the first chopper circuit including a first switching circuit configured to alternatively switch between two single-ended signals of the differential input signal according to a clock signal to provide a first chopped differential input signal to the third amplifier input; and
a second chopper circuit positioned between the third amplifier output and the fourth amplifier input, the second chopper circuit including a second switching circuit configured to alternatively switch between two single-ended signals of a differential output signal from the third amplifier output according to the clock signal to provide a second chopped differential input signal to the fourth amplifier input.

4. The multistage amplifier circuit of claim 2, comprising:
a compensation capacitance including a first terminal coupled with the second amplifier output, and a second terminal coupled with the fourth amplifier input; and
a clamp circuit coupled with the fourth amplifier input to selectively maintain a voltage at the second terminal of the compensation capacitance when the sensor circuit output signal is in the first state.

5. The multistage amplifier circuit of claim 4, wherein the clamp circuit is configured to drive a voltage between the first differential input of the fourth amplifier and the second differential input of the fourth amplifier when the sensor circuit output signal is in the first state.

6. The multistage amplifier circuit of claim 5, comprising:
a third circuit providing a feedback loop to the second forward circuit, the third circuit including:
a sixth amplifier having a sixth amplifier input coupled with the fourth amplifier input,
a seventh amplifier having a seventh amplifier input coupled with an output of the sixth amplifier, and
a notch filter coupled between the output of the sixth amplifier and the seventh amplifier input; and
a second sample hold circuit coupled with the seventh amplifier input to maintain an amplitude of a signal at the seventh amplifier input when the sensor circuit output signal is in the first state.

7. The multistage amplifier circuit of claim 6, wherein the input signal is a differential signal, and wherein the second forward circuit comprises:
a first chopper circuit positioned between the first amplifier input and the third amplifier input, the first chopper circuit including a first switching circuit configured to alternatively switch between two single-ended signals of the differential input signal according to a clock signal to provide a first chopped differential input signal to the third amplifier input; and
a second chopper circuit positioned between the third amplifier output and the fourth amplifier input, the second chopper circuit including a second switching circuit configured to alternatively switch between two single-ended signals of a differential output signal from the third amplifier output according to the clock signal to provide a second chopped differential input signal to the fourth amplifier input.

8. The multistage amplifier circuit of claim 6, wherein the third circuit includes a third chopper circuit positioned between the output of the sixth amplifier and the notch filter, the third chopper circuit including a third switching circuit to alternatively switch between two single-ended signals of a differential output signal of the sixth amplifier according to the clock signal to provide a third chopped differential input signal to the notch filter.

9. The multistage amplifier circuit of claim 1, comprising:
a compensation capacitance including a first terminal coupled with the second amplifier output, and a second terminal coupled with the fourth amplifier input; and
a clamp circuit coupled with the fourth amplifier input to selectively maintain a voltage at the second terminal of the compensation capacitance when the sensor circuit output signal is in the first state.

10. The multistage amplifier circuit of claim 9, wherein the fourth amplifier input includes first and second differential inputs, wherein the clamp circuit is configured to drive a voltage between the first differential input of the fourth amplifier and the second differential input of the fourth amplifier when the sensor circuit output signal is in the first state.

11. The multistage amplifier circuit of claim 1, comprising:
a third circuit providing a feedback loop to the second forward circuit, the third circuit including:
a sixth amplifier having a sixth amplifier input coupled with the fourth amplifier input,
a seventh amplifier having a seventh amplifier input coupled with an output of the sixth amplifier, and
a notch filter coupled between the output of the sixth amplifier and the seventh amplifier input; and
a second sample hold circuit coupled with the seventh amplifier input to maintain an amplitude of a signal at the seventh amplifier input when the sensor circuit output signal is in the first state.

12. The multistage amplifier circuit of claim 1, comprising:
a third circuit providing a feedback loop to the second forward circuit, the third circuit including:
a sixth amplifier having a sixth amplifier input coupled with the fourth amplifier input, and
a seventh amplifier having a seventh amplifier input coupled with an output of the sixth amplifier; and
a second sample hold circuit coupled with the seventh amplifier input to maintain an amplitude of a signal at the seventh amplifier input when the sensor circuit output signal is in the first state.

13. The multistage amplifier circuit of claim 12, wherein the third circuit further includes a notch filter coupled between the output of the sixth amplifier and the seventh amplifier input.

14. The multistage amplifier circuit of claim 12, wherein the first, third, fourth, fifth, sixth, and seventh amplifiers are transconductance amplifiers with differential inputs and differential outputs.

15. The multistage amplifier circuit of claim 12:
wherein the first sample hold circuit includes a first switch to selectively disconnect a first capacitance from at least one differential output terminal of the fourth amplifier to maintain a voltage signal amplitude at the fifth amplifier input when the sensor circuit output signal is in the first state, and to connect the first capacitance to the at least one differential output terminal of the fourth amplifier to allow the output of the fourth amplifier to be provided to the fifth amplifier input when the sensor circuit output signal is in the second state; and wherein the second sample hold circuit includes a second switch to selectively disconnect a second capacitance from at least one differential output terminal of the sixth amplifier to maintain a voltage signal amplitude at the seventh amplifier input when the sensor circuit output signal is in the first state, and to connect the second capacitance to the at least one differential output terminal of the sixth amplifier to allow the output of the sixth amplifier to be provided to the seventh amplifier input when the sensor circuit output signal is in the second state.

16. The multistage amplifier circuit of claim 1, wherein the first sample hold circuit includes a first switch to selectively disconnect a first capacitance from at least one differential output terminal of the fourth amplifier to maintain a voltage signal amplitude at the fifth amplifier input when the sensor circuit output signal is in the first state, and to connect the first capacitance to the at least one differential output terminal of the fourth amplifier to allow the output of the fourth amplifier to be provided to the fifth amplifier input when the sensor circuit output signal is in the second state.

* * * * *